(12) United States Patent
Becker et al.

(10) Patent No.: US 11,563,378 B2
(45) Date of Patent: Jan. 24, 2023

(54) SEAMLESS DCM-PFM TRANSITION FOR SINGLE PULSE OPERATION IN DC-DC CONVERTERS

(71) Applicant: TEXAS INSTRUMENTS INCORPORATED, Dallas, TX (US)

(72) Inventors: Julian Becker, Freising (DE); Christian Harder, Freising (DE); Eduardas Jodka, Freising (DE); Stefan Dietrich, Oberding (DE); Puneet Sareen, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/000,854

(22) Filed: Aug. 24, 2020

(65) Prior Publication Data
US 2021/0083583 A1 Mar. 18, 2021

Related U.S. Application Data

(60) Provisional application No. 62/909,555, filed on Oct. 2, 2019, provisional application No. 62/900,941, filed on Sep. 16, 2019.

(51) Int. Cl.
*H02M 1/08* (2006.01)
*H02M 3/156* (2006.01)
(Continued)

(52) U.S. Cl.
CPC .... *H02M 3/1584* (2013.01); *G01R 19/16528* (2013.01); *G05F 3/262* (2013.01);
(Continued)

(58) Field of Classification Search
CPC ...... H02M 1/0025; H02M 1/08; H02M 3/156; G05F 1/462; G05F 1/575
See application file for complete search history.

(56) References Cited

U.S. PATENT DOCUMENTS 9,991,775 B1 * 6/2018 Lin ........................ H02M 5/293
2011/0018507 A1 * 1/2011 McCloy-Stevens ........................ H02M 3/1588
323/271

(Continued)

*Primary Examiner* — Gary A Nash
(74) *Attorney, Agent, or Firm* — Valerie M. Davis; Frank D. Cimino

(57) ABSTRACT

A converter operable to convert an input voltage at an input node to an output voltage at an output node coupled to a load by switching on and off a transistor at a switching frequency, the converter comprising: an error amplifier circuit having a first input coupled to a reference voltage, a second input coupled to the output node through a resistive divider, a first output operable to output a control current and a second output operable to output a current equivalent to the control current; a peak current comparator circuit having a first input coupled to the second output of the error amplifier circuit, a second input and an output, the second input is coupled to the input node through an inductor; an off-time timer circuit having an input coupled to the first output of the error amplifier circuit and an output, the off-time timer circuit operable to set the switching frequency based on the control current; and a control circuit having a first input coupled to the output of the peak current comparator circuit, a second input coupled to the output of the off-time timer circuit and an output coupled to a control terminal of the transistor.

20 Claims, 6 Drawing Sheets

(51) Int. Cl.
*G05F 1/46* (2006.01)
*H02M 3/158* (2006.01)
*H03K 5/24* (2006.01)
*G05F 3/26* (2006.01)
*G01R 19/165* (2006.01)
*H02M 1/14* (2006.01)
*H02M 1/00* (2006.01)
*G05F 1/575* (2006.01)

(52) U.S. Cl.
CPC ................ *H02M 1/14* (2013.01); *H03K 5/24* (2013.01); *G05F 1/462* (2013.01); *G05F 1/575* (2013.01); *H02M 1/0009* (2021.05); *H02M 1/0012* (2021.05); *H02M 1/0025* (2021.05); *H02M 1/08* (2013.01); *H02M 3/156* (2013.01)

(56) References Cited

U.S. PATENT DOCUMENTS

| | | | | |
|---|---|---|---|---|
| 2013/0154595 A1* | 6/2013 | Drinovsky | ............ | H02M 3/156 323/282 |
| 2015/0123638 A1* | 5/2015 | Thiele | ................... | H02M 3/156 323/293 |
| 2015/0340952 A1* | 11/2015 | Manohar | ............... | H02M 3/158 323/271 |

* cited by examiner

SEAMLESS DCM-PFM TRANSITION FOR SINGLE PULSE OPERATION IN DC-DC CONVERTERS

CROSS-REFERENCE TO RELATED APPLICATIONS

The application claims priority to U.S. Provisional Application No. 62/900,941, filed Sep. 16, 2019 entitled "Seamless DCM-PFM Transition for Single Pulse Operation in DC-DC Converters" and to U.S. Provisional Application No. 62/909,555, filed Oct. 2, 2019 entitled "Seamless DCM-PFM Transition for Single Pulse Operation in Fixed Frequency DC-DC Converters supporting Frequency Avoidance," both of which are hereby incorporated herein by reference in their entirety.

BACKGROUND

Battery operated devices, such as personal electronic devices, robots, electric cars, industrial equipment, medical equipment and wearable devices, require a stable and consistent power source. In addition, longer battery life is desirable so high efficiency (especially during light loads) is important. Highly efficient voltage regulators may be used in these applications to provide a regulated voltage from the battery to the device while requiring less battery power to operate. In addition, display devices (such as organic light-emitting diode displays) also incorporate voltage regulators. A stable output voltage with minimal ripple is important for the proper operation of these display devices.

Switching regulators, also referred to as DC-DC converters, are used to convert or regulate an input voltage to an output voltage. The input voltage can be greater than, less than or equal to the output voltage. If the input voltage is greater than the output voltage, the converter/regulator may be referred to as a "step-down" converter/regulator or a "buck converter". FIG. 1A illustrates a basic buck converter. If the input voltage is less than the output voltage, the converter/regulator may be referred to as a "step-up" converter/regulator or a "boost converter". FIG. 1B illustrates a basic boost converter. If the converter/regulator can perform both step-up and step-down functions, then it may be referred to as a "buck-boost converter". FIG. 1C illustrates an inverting buck-boost converter.

Generally, switching regulators include at least one power switch and one or more energy storage devices, such as an inductor and a capacitor. The power switch can be implemented using a metal-oxide-silicon field-effect transistor (MOSFET), bipolar junction transistor (BJT) or other type of power transistor. The switching regulator may include a high-side switch and a low-side switch or a single power switch and a diode. FIGS. 1a, 1b and 1c illustrate converters using a single power switch and a diode. To implement the high-side/low-side configuration, the diode can be replaces with a transistor. Operation of the switching regulator basically includes turning on the power switch to supply energy to the inductor followed by turning off the power switch resulting in the transfer of the stored energy in the inductor to a load (and an output capacitor). The switching on and off of the power switch is controlled based on the load characteristics and the energy required by the load.

The switching of the power switch can be accomplished using different modes of operation, and the switching converter may switch from one mode to the next. Continuous-conduction mode (CCM) of operation occurs where the increase in energy stored in the inductor during the on-time of the power switch is equal to the energy discharged to the output during the off-time of the power switch. Any residual energy remains stored in the inductor. During the next on-time of the power switch, energy builds from the residual energy to a point required by the load in the next switching cycle.

Another mode of operation is the discontinuous-conduction mode (DCM). In this mode of operation, energy stored in the inductor during the on-time of the power switch is equal to the energy required by the load during a single switching cycle plus energy lost due to converter losses. Basically, the energy in the inductor depletes to zero before the end of the switching cycle in DCM but some residual energy remains in the inductor at the end of a switching cycle in CCM. DCM can be used with mid-range loads, and CCM may be used with higher-range loads. Both DCM and CCM utilize constant switching cycles (for example, the frequency for switching the transistor on and off remains constant).

Other modes of operation utilize feedback to vary the frequency or duty cycle of the switching cycles. Pulse width modulation (PWM) uses a fixed switching cycle but varies the on-time versus the off-time (duty cycle) based on feedback. Due to the fixed switching cycle, any switching noise is predictable but it also is less efficient during light-load conditions compared to PFM/PSM and DCM. Pulse frequency modulation (PFM) varies the switching frequency (with fixed on-time or fixed off-time) proportional to the load. In other words, as the load increases the number of on-times for a certain time period will increase. Since the switching frequency increases as the load increases, switching noise increases in a manner that may not be easily filtered. In light of this, PFM provides high efficiency and less switching noise during lighter load conditions. Pulse skip mode (PSM) is used in converters having a clock input. Instead of dynamically adjusting the pause between switching cycles (PFM), switching cycles are skipped, such as by masking the clock signal internally. Pulse-grouping (also referred to as burst behavior) resulting in an increased output voltage ripple can occur during PFM and PSM.

Transitions from one mode to another may cause output voltage ripple, additional switching noise, loss of efficiency and/or audible noise.

SUMMARY

An example embodiment includes a converter operable to convert an input voltage at an input node to an output voltage at an output node coupled to a load by switching on and off a transistor at a switching frequency, the converter comprising: an error amplifier circuit having a first input coupled to a reference voltage, a second input coupled to the output node through a resistive divider, a first output operable to output a control current and a second output operable to output a current equivalent to the control current; a peak current comparator circuit having a first input coupled to the second output of the error amplifier circuit, a second input and an output, the second input is coupled to the input node through an inductor; an off-time timer circuit having an input coupled to the first output of the error amplifier circuit and an output, the off-time timer circuit operable to set the switching frequency based on the control current; and a control circuit having a first input coupled to the output of the peak current comparator circuit, a second input coupled to the output of the off-time timer circuit and an output coupled to a control terminal of the transistor. The converter is operable to operate in a mode of operation including:

continuous conduction mode (CCM), discontinuous conduction mode (DCM), pulse frequency mode (PFM) and pulse width modulation mode (PWM), and the converter is operable to switch from one mode operation to another mode of operation. The converter is operable to reduce voltage ripple on the output voltage during a transition from one mode of operation to another mode of operation. The output current is modulated from a valley current value to a peak current value at the switching frequency, and the peak current value is based on the control current. In other example embodiments, the error amplifier circuit includes: an error amplifier having inputs coupled to the first and second inputs of the error amplifier circuit and an output; a first transistor having a first current terminal coupled to a supply voltage, a second current terminal coupled to the output of the error amplifier and a control terminal coupled to the second current terminal, the first transistor having a transistor current equivalent to the control current; a second transistor having a first current terminal coupled to the supply voltage, a second current terminal coupled the input of the off-time timer circuit and a control terminal coupled to the control terminal of the first transistor, the first transistor and the second transistor form a first current mirror; and a third transistor having a first current terminal coupled to the supply voltage, a second current terminal coupled the first input of the peak comparator circuit and a control terminal coupled to the control terminal of the first transistor, the first transistor and the third transistor form a second current mirror. The current from the first current terminal to the second current terminal of the second transistor is equivalent to the control current and a current from the first current terminal to the second current terminal of the third transistor is equivalent to the control current.

Another example embodiment includes a control circuit operable to switch a transistor on and off at a switching frequency to convert an input voltage at an input node to an output voltage at an output node coupled to a load, the control circuit comprising: an error amplifier circuit operable to generate a control current and having a first output operable to output a first current and a second output operable to output a current, the first output current and the second output current are equivalent to the control current; a peak current comparator circuit having a first input coupled to the second output of the error amplifier circuit, a second input and an output, the second input is coupled to the input node through an inductor; an off-time timer circuit having an input coupled to the first output of the error amplifier circuit and an output, the off-time timer circuit operable to set the switching frequency based on the control current; and a control circuit having a first input coupled to the output of the peak current comparator circuit, a second input coupled to the output of the off-time timer circuit and an output coupled to a control terminal of the transistor. Based on control signals from the control circuit, the converter is operable to operate in a mode of operation such as the continuous conduction mode (CCM), discontinuous conduction mode (DCM), pulse frequency mode (PFM) and pulse width modulation mode (PWM), and the converter is operable to switch from a first mode operation to a second mode of operation. The current through the inductor is modulated from a valley current value to a peak current value at the switching frequency. In some embodiments, the switching frequency is fixed and the peak current value is variable during the first mode of operation, and the switching frequency is variable and the peak current value is fixed during the second mode of operation. In another embodiment, the converter is operable to operate in a transition mode of operation after the first mode of operation and before the second mode of operation, and the switching frequency and the peak current value are variable during the transition mode of operation. The peak current comparator circuit is operable to set the peak current value based on the control current.

Another example embodiment includes a method of operating a converter operable to convert an input voltage at an input node to an output voltage at an output node coupled to a load, the method comprising the steps of: switching a transistor on and off during a heavy load period at a fixed switching frequency to provide pulses of current to the load and varying a maximum current per pulse of current; switching the transistor on and off during a light load period at a fixed maximum current per pulse of current and varying the switching frequency; and switching the transistor on and off during a period between the heavy load period and the light load period by varying the switching frequency and the maximum current per pulse of current. The maximum current per pulse of current is $I_{PEAK}$, and the switching frequency is $F_{SW}$.

BRIEF DESCRIPTION OF THE DRAWINGS

For a detailed description of various examples, reference will now be made to the accompanying drawings in which.

DETAILED DESCRIPTION

To take advantage of the positive aspects of the various modes of operation while minimizing the disadvantages of the different modes depending on the type of load, example embodiments use certain modes for light loads, other modes for medium loads and other modes for heavy loads. However, while the disadvantages of a particular mode of operation may be minimized by switching modes, the transition from one mode to another may create new issues. For example, a transition from CCM or DCM, where the switching frequency is fixed, to PFM or PSM, where the switching frequency is not fixed, may cause higher output voltage ripple during the transition. In addition, switching frequencies may be limited to out-of-audio frequency bands. In light of this, some example embodiments (such as a boost converter, buck converter or a buck-boost converter) implement mode transitions that cause little output ripple (referred to herein as "seamless transitions") and/or avoid switching frequencies in the certain (such as audible) frequency bands. Some example embodiments may include methods of operating and circuitry for providing a "seamless transition" from one mode to another mode.

Figure 2:
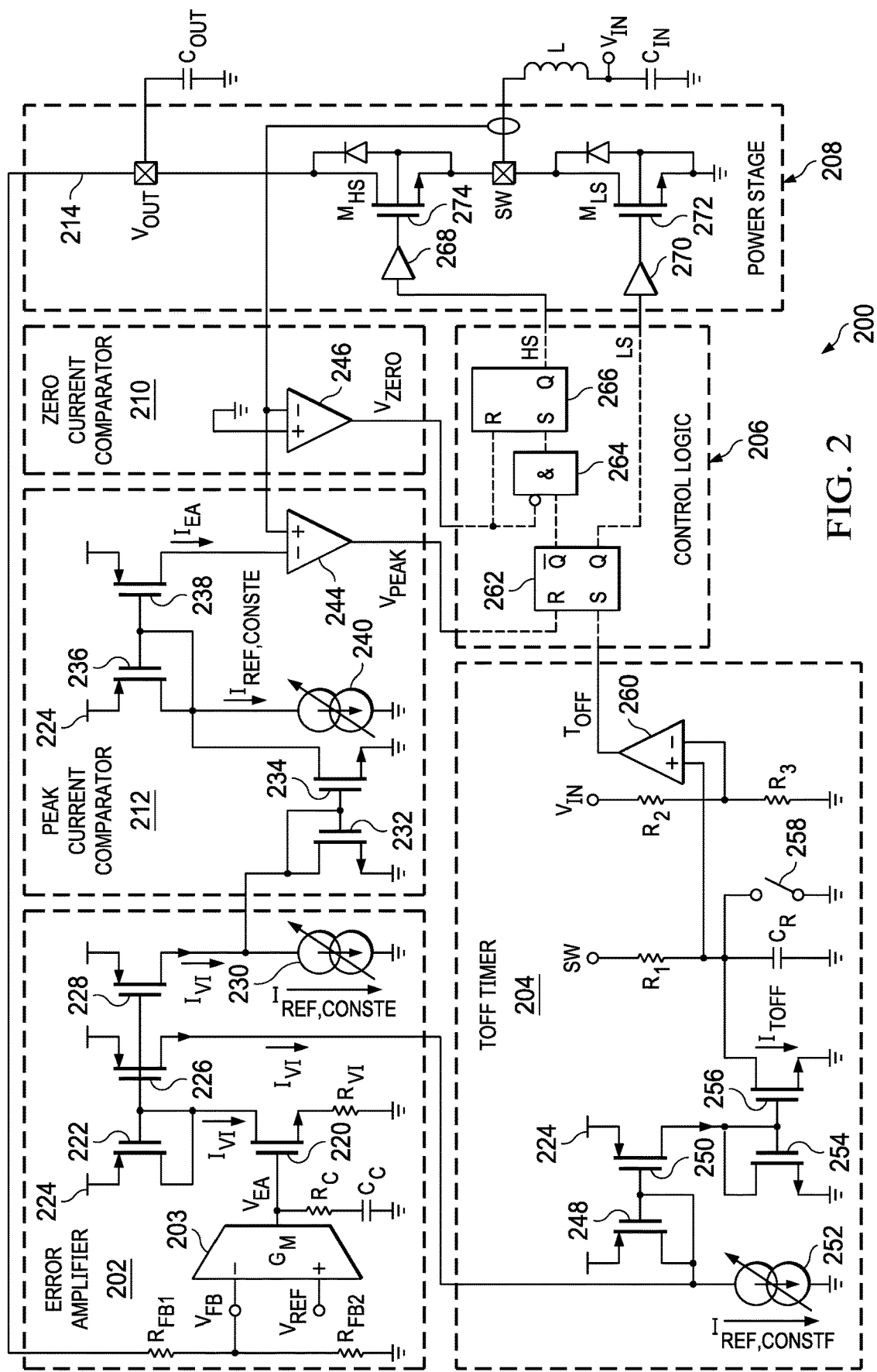
FIG. 2 is a schematic diagram of a boost converter of various example embodiments.

The schematic of FIG. 2 illustrates a boost converter 200 of various example embodiments. Some example embodiments of boost converter 200 use control current $I_{VT}$ to generate the modulation current, $I_{TOFF}$, of the off-time timer circuitry 204 and the peak current control current, $I_{EA}$, of the peak current comparator circuit 212. In some example embodiments, modulation current $I_{TOFF}$ is used to establish the off-time $T_{OFF}$, and peak current control current $I_{EA}$ is used to establish the cycle-to-cycle peak current. In some example embodiments, $I_{EA}$ is clipped (for example, by holding it at a constant value until $I_{VT}$ becomes greater than a predetermined value) to enable minimum peak inductor current switching cycles. In some example embodiments, if $I_{TOFF}$ is greater than zero then the switching frequency is reduced due to an increase in $T_{OFF}$.

Figure 1A:
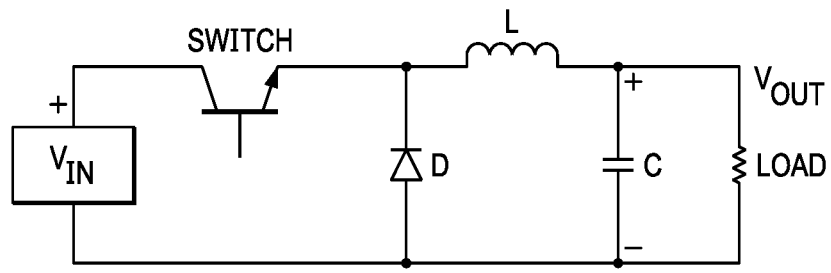
FIG. 1A is a schematic diagram of a traditional buck converter.
Figure 1B:
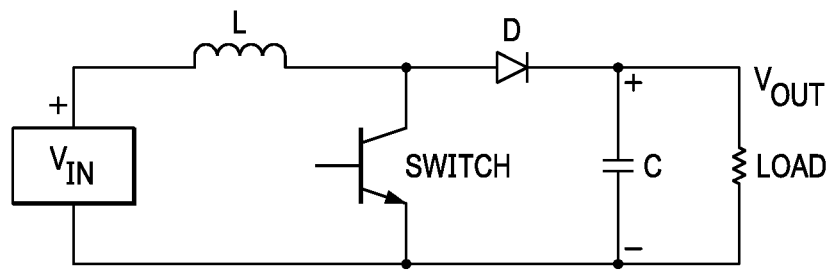
FIG. 1B is a schematic diagram of a traditional boost converter.
Figure 1C:
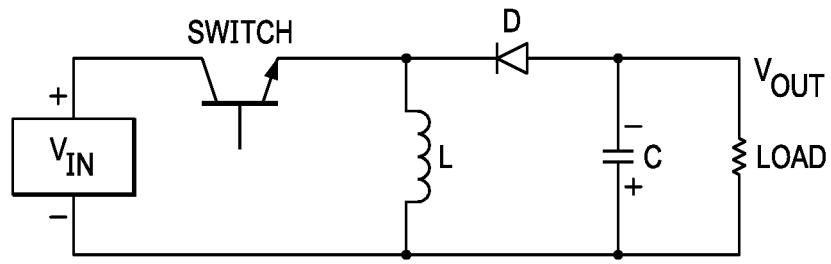
FIG. 1C is a schematic diagram of a traditional inverting buck-boost converter.

Boost converter 200 may include a power stage 208, control logic 206, zero current comparator circuit 210, peak current comparator circuit 212, off-time ($T_{OFF}$) timer circuitry 204, and error amplifier circuitry 202. While specific components and layout are depicted in FIG. 2, some components may be replaced by other components or removed. For example, a capacitor, $C_{IN}$, is connected to input voltage, $V_{IN}$, to reduce ripple on the input voltage. While this capacitor is advantageous, the example embodiments will function without the inclusion of this capacitor. In addition, the value of the capacitor may be varied based on the application that boost converter 200 is used. Similar to the boost converter illustrated in FIG. 1B, inductor, L, is connected between the input terminal and the switching terminal, SW. However, the example embodiment of FIG. 2 utilizes a high-side transistor 274, $M_{HS}$, instead of a diode, D, in FIG. 1B. The high-side transistor 274 and the low-side transistor 272, $M_{LS}$, may be implemented using an n-type or p-type metal-oxide-silicon field-effect transistor (nMOSFET or pMOSFET, respectively), bi-polar junction transistors (BJT) or other similar devices. FIG. 2 illustrates the body diodes between the source and drain for high-side transistor 274 and low-side transistor 272. These body diodes are part of the transistors and are configured based on the layout and fabrication of the transistors.

The high-side transistor 274 is connected between the switching node (SW) and the output node (where the output voltage, $V_{OUT}$, is applied). An output capacitor, $C_{OUT}$, may be connected between the output terminal and ground. A feedback conductor 214 is provided from the output node to error amplifier circuit 202. Gate drivers 268 and 270 are connected between control logic 206 and high-side transistor 274 and low-side transistor 272, respectively, to drive the transistors based on the high-side, HS, and low-side, LS, outputs of control logic 206.

In the example embodiment of FIG. 2, control logic 206 includes set-reset flip-flops 262 and 266 and AND gate 264. AND gate 264 includes an inverted input connected to the output of zero current comparator circuit 210 and the reset input of flip-flop 266. Control logic 206 may be implemented with more, less or different logic gates and flip-flops than those depicted in FIG. 2. The reset input of flip-flop 262 is connected to the peak detection voltage, $V_{PEAK}$, output of peak current comparator circuit 212, and the set input of flip-flop 262 is connected to the off-time ($T_{OFF}$) output of off-time timer circuit 204. The Q output of flip-flop 262 is connected to low-side gate driver 270 and the Q-bar output (the inverse of the Q output) of flip-flop 262 is connected to one input of AND gate 264. The output of AND gate 264 is connected to the set input of flip-flop 266, and the Q output of flip-flop 266 is connected to the high-side gate driver 268.

In general operation, control logic 206 turns on the high-side transistor 274 when the set input is a "1" (logical high) and the reset input is a "0" (logical low) for flip-flop 266. The set input to flip-flop 266 is a "1" when the output of AND gate 274 is high, and the reset input is a "0" (hence, $V_{ZERO}$ is low—meaning that the sensed inductor current is greater than zero, such as when current is flowing from $V_{IN}$ to $V_{OUT}$). This occurs when the Q-bar output of flip-flop 262 is a "1" (the Q output of flip-flop 261 would be a "0") and the output of comparator 246 is low. For Q-bar to be a "1", flip-flop 262 is reset by $V_{PEAK}$ changing to high (the sensed inductor current is greater than a threshold value determined by $I_{EA}$ on the inverting input of comparator 244) while $T_{OFF}$ is low. $T_{OFF}$ should be low ("0") while the low-side is ON (such as when "LS" is high) because switch 258 is closed while LS is high. Conversely, low-side transistor 272 is turned on when the Q output of flip-flop 262 is a "1" (Q-bar output would be a "0" during this period). The Q out is a "1" when the set input is a "1" (meaning $T_{OFF}$ is high signifying the "off time" is over) and the reset input is a "0" (meaning that the sensed inductor current is less than the peak current threshold discussed above.

Peak current comparator circuit 212 includes two current mirrors (one formed by transistors 232 and 234 and the other formed by transistors 236 and 238), variable current source 240 and current comparator 244. If transistors 232 and 234 have equivalent sizes, the current flowing through transistor 234 will mirror the current flowing through transistor 232. Similarly, the current through transistor 238 will mirror the current flowing through transistor 236 if the transistors are similarly sized. Variable current source 240 is connected between the drain of transistor 234 and ground and is connected between the drain of transistor 236 and ground. The inverting input of current comparator 244 is connected to and the drain of transistor 238. The sources of transistors 232 and 234 are connected to ground and the sources of transistors 236 and 238 are connected to voltage supply 224.

Sensed inductor current is coupled to the non-inverting input of current comparator 244. In some example embodiments, the sensed inductor current is a fixed ratio (such as 1/100,000) of the actual inductor current. Peak current control current, $I_{EA}$, is coupled to the inverting input of current comparator 244, so that when the sensed inductor current is greater than $I_{EA}$, $V_{PEAK}$ goes high. Otherwise, $V_{PEAK}$ will be low. Hence, $I_{EA}$ is defining the cycle-to-cycle peak current of the converter. In operation for some example embodiments, when the inductor current is low, the low-side (LS) is activated by $T_{OFF}$ via the set input of flip-flop 262. During this period, the energy stored in the inductor is increasing (along with increasing the inductor current). When the sensed inductor current is greater than $I_{EA}$, the output of current comparator 244 changes from low to high thereby resetting flip-flop 262 and deactivating the low-side (LS goes low for an nMOSFET). The high-side is then activated (HS goes high for an nMOSFET) and remains activated until $V_{ZERO}$ goes high (such as when the inductor current goes to zero or starts flowing to $V_{IN}$) or $T_{OFF}$ goes high.

Error amplifier circuitry 202 includes feedback conductor 214 connecting the output terminal to the inverting input of operational transconductance amplifier (OTA) 203 through a resistive divider (including resistors $R_{FB1}$ and $R_{FB2}$) connected to ground. The non-inverting input of OTA 203 is connected to reference voltage, $V_{REF}$, and the output is connected to the gate of transistor 220 to supply voltage, $V_{EA}$, to the gate. Additionally, the output of OTA 203 is connected to ground through resistor $R_C$ and capacitor $C_C$. The source of transistor 220 is connected to ground through resistor $R_{VI}$. Current $I_{VI}$ flows from voltage supply 224 through transistors 222 and 220. Since transistors 222, 226 and 228 form a current mirror, current $I_{VI}$ is mirrored by transistors 226 and 228. Based on the use of current mirrors in $T_{OFF}$ timer circuitry 204 (one formed by transistors 248 and 250 and the other formed by transistors 254 and 256), timer control current $I_{TOFF}$ is equal to the difference of $I_{VI}$ and the current $I_{REF,CONSTF}$ provided by the variable current source 252, and, since current mirrors support positive currents, $I_{TOFF}$ should be equal to or greater than zero. Similarly, since transistors 232 and 234 form a current mirror, the current through transistor 234 will be equal to the difference of $I_{VI}$ and the current $I_{REF,CONSTE}$ provided by the variable current source 230, and, since transistors 236 and 238 form another current mirror, the current through transistor 238 will be equal to $I_{VI}$ minus the current $I_{REF,CONSTE}$ provided by the variable current source 230 plus the current $I_{REF,CONSTE}$ provided by variable current source 240. Since current mirrors (232-234 and 236-238) support positive currents, $I_{EA}$ is equal to $I_{VI}$ while $I_{VI}$ is greater than $I_{REF,CONSTE}$. If $I_{VI}$ is less than $I_{REF,CONSTE}$, $I_{EA}$ is clipped low to $I_{REF,CONSTE}$. Hence, a minimum peak current operation is implemented using this example embodiment.

As stated previously, the timer control current $I_{TOFF}$ and the peak current control current $I_{EA}$ are based on the control current $I_{VI}$. By selecting $I_{REF,CONSTF}$ to be greater than $I_{REF,CONSTE}$ a "transition range" (for the mode of operation) is defined (as discussed below). When $I_{VI}$ is greater than $I_{REF,CONSTF}$, $I_{TOFF}$ is clipped to around zero while $I_{EA}$ is equal to $I_{VI}$. When $I_{VI}$ is less than $I_{REF,CONSTE}$, $I_{EA}$ is clamped to $I_{REF,CONSTE}$ (also referred to as the "clipped minimum peak current") while $I_{TOFF}$ is increasing with decreasing $I_{VI}$. When the value of $I_{VI}$ is between $I_{REF,CONSTE}$ and $I_{REF,CONSTF}$ both $I_{TOFF}$ and $I_{EA}$ are set by the value of $I_{VI}$.

The value of $I_{VI}$ is set by the integration of the error signal, $V_{ref}$-$V_{fb}$ and the conversion of output voltage of OTA 203 to current by transistor 220 and resistor $R_{VI}$. Resistor $R_C$ is a compensation resistor, and capacitor $C_C$ is a compensation capacitor.

The off-time timer circuitry 204 provides off-time signal $T_{OFF}$ that defines the off-time for the boost converter 200 (for example, the period when the inductor current increases is sometimes referred to as $T_{ON}$, while the period when the inductor current decreases is referred to as $T_{OFF}$—it may also be considered to be the time when the high-side transistor is turned off) in addition to the switching frequency (on-off switching of high-side and low-side transistors 274 and 272, respectively). In some example embodiments, $T_{OFF}$ is defined by the same control loop, and the characteristics of $T_{OFF}$ may vary based on the mode of operation.

Off-time timer circuitry 204 includes two current mirrors. One is formed by transistors 248 and 250 and the other is formed by transistors 254 and 256. The sources of transistors 248 and 250 are connected to voltage supply 224 and the sources of transistors 254 and 256 are connected to ground. Variable current supply 252 is connected between ground and the drain and gate of transistor 248. The gate and drain of transistor 254 are connected to the drain of transistor 250. The drain of transistor is connected to capacitor $C_R$ and switch 258 (both connected in parallel between the drain and ground), switching node SW through resistor $R_1$ and to the non-inverting input of comparator 260. The inverting input of comparator 260 is connected to $V_{IN}$ and ground through a resistive divider from by resistors $R_2$ and $R_3$.

In example embodiments, the values of $R_1$, $R_2$, $R_3$ and $C_R$ are selected so that the $T_{OFF}$ time combined with the $T_{ON}$ time results in a quasi-constant frequency (a frequency that is virtually independent of the values of $V_{IN}$, $V_{OUT}$ and the load) in CCM and DCM. Reset/discharge switch 258 is closed when LS is ON and $T_{OFF}$ is low. The voltage ramp created by $R_1$ and $C_R$ rises while LS is OFF (whether HS is ON or OFF). If the voltage ramp (coupled to the non-inverting input of comparator 260) becomes greater than the reference voltage (proportional to $V_{IN}$) connected to the inverting input of comparator 260, $T_{OFF}$ transitions from low to high (thereby indicating the end of $T_{OFF}$). If $I_{TOFF}$ is greater than zero amps, the voltage ramp (created by $R_1$ and $C_R$) is slower (or stopped) thereby extending $T_{OFF}$. Hence, the control loop (via $I_{VI}$ and $I_{TOFF}$) reduces switching frequency and extending $T_{OFF}$ (such as for light loads). The frequency of the pulses will be modulated (PFM).

Figure 3:
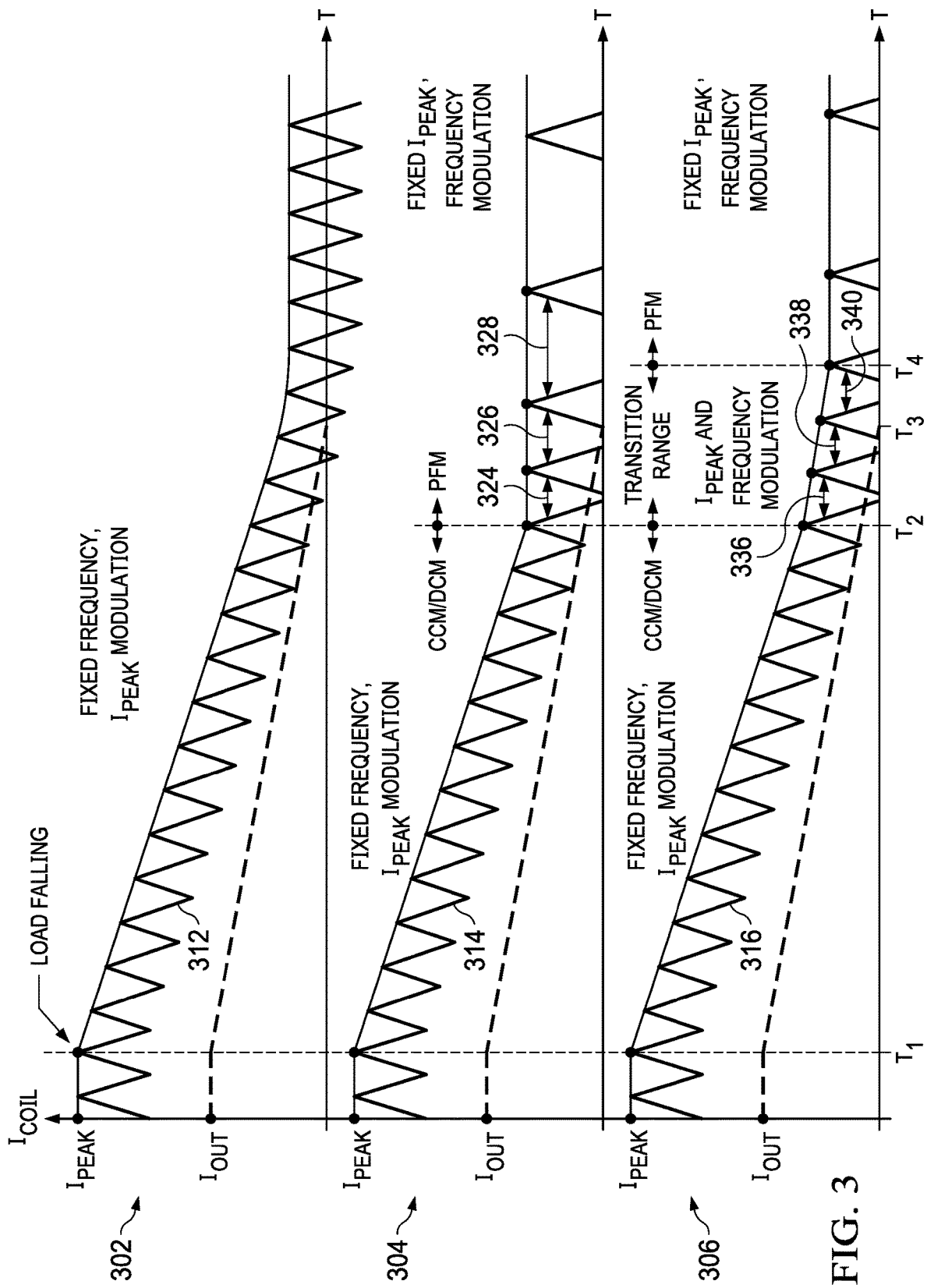
FIG. 3 includes graphs of inductor current versus time in accordance with various example embodiments.
Figure 4A:
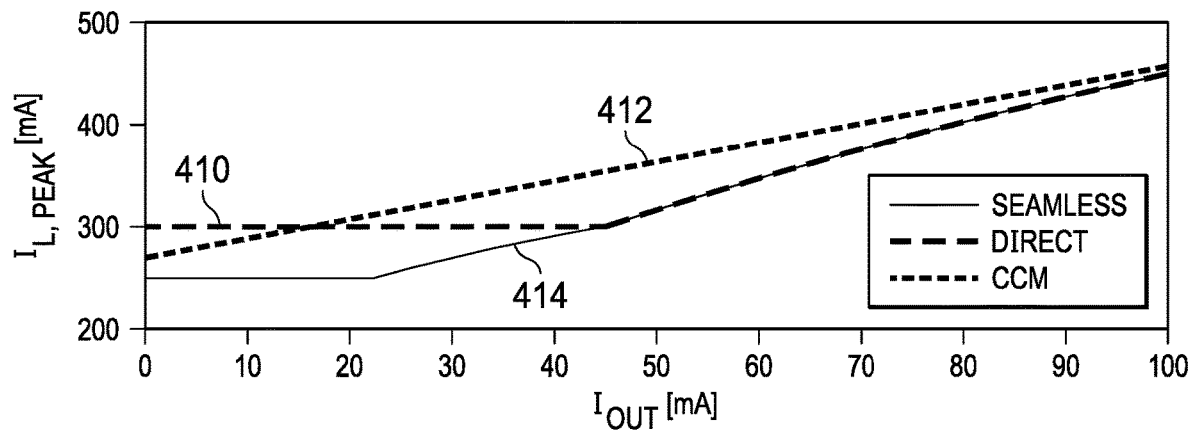
FIG. 4A includes a graph of peak inductor current ($I_{L,PEAK}$) versus output current ($I_{OUT}$) in accordance with various example embodiments.
Figure 4B:
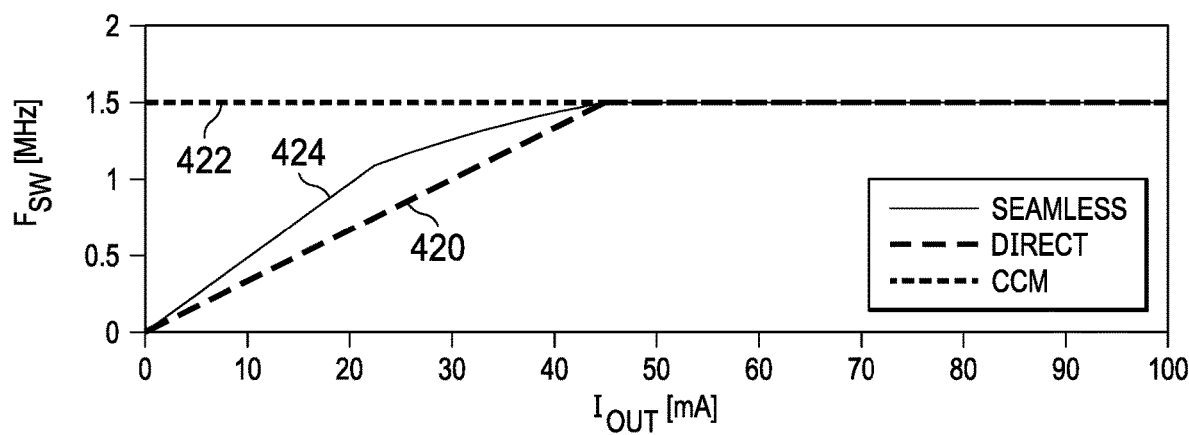
FIG. 4B includes a graph of switching frequency ($F_{SW}$) versus output current in accordance with various example embodiments.

FIG. 3 includes three graphs (graphs 302, 304 and 306) illustrating current through the inductor L (referred to in these graphs as $I_{COIL}$ and referred to in other figures as $I_L$) versus time for a boost converter (such as boost converter 200 of FIG. 2). For each of these graphs, the load current (also referred to as the output current), $I_{OUT}$, starts decreasing at time $t_1$ and continues to decrease until it reaches zero at $t_3$. Graph 302 illustrates the inductor current 312 provided by the boost converter where the boost converter remains in CCM (continuous conduction mode—where the switching frequency remains fixed). $I_{PEAK}$ is defined by the control loop via $I_{EA}$ in peak current comparator 212 and is the cycle-to-cycle peak current for the boost converter. At a time between t2 and t3, the coil current becomes negative signifying a change in direction of the current flow (such as flowing to the input supply instead of flowing from the input supply). Referring to FIGS. 4A and 4B, graphs 412 and 422, respectively, illustrate the peak inductor current (referred to as $I_{L,PEAK}$ in FIG. 4A) and the switching frequency ($F_{SW}$) versus the output current ($I_{OUT}$) where the input voltage ($V_{IN}$) is around 3.85 V, the output voltage ($V_{OUT}$) is around 7.2 V and the inductor L is around 2.2 µH.

Graph 304 of FIG. 3 illustrates the inductor current 314 provided by the boost converter where the boost converter remains in CCM or DCM (where the switching frequency remains fixed and $I_{PEAK}$ may vary) from $t_1$ to $t_2$ and instantly changes mode from CCM/DCM to PFM (where $I_{PEAK}$ remains at a fixed value and the switching frequency is modulated) at $t_2$. The efficiency of the boost converter is kept at a high level due to the change in switching frequency as the load current decreases, however the abrupt change in modes causes increased output ripple. The change in switching frequency is illustrated by the increased spacings 324, 326 and 328 of graph 314. Referring to FIGS. 4A and 4B, graphs 410 and 420, respectively, illustrate the peak inductor current versus the output current and the switching frequency versus the output current where the input voltage is around 3.85 V, the output voltage is around 7.2 V and the inductor L is around 2.2 µH. The transition from CCM/DCM to PFM can be seen in FIGS. 4A and 4B for an $I_{OUT}$ value between 40 and 50 mA.

Graph 306 of FIG. 3 illustrates the inductor current 316 provided by the boost converter where the boost converter utilizes the advantageous mode transition (also referred to as the seamless transition) of several example embodiments (occurring between $t_2$ and $t_4$) between the CCM/DCM (from $t_1$ to $t_2$) and PFM (starting at $t_4$). The efficiency of the boost converter is kept at a high level due to the change in switching frequency as the load current decreases, and the output ripple remains low due to the gradual transition provided by the example embodiments. A less abrupt (as compared to graph 314) change in switching frequency is illustrated by the spacings 336, 338 and 340 of graph 316, and a less abrupt transition in $I_{PEAK}$ is illustrated by the gradual change in slope of $I_{PEAK}$ at $t_2$ and $t_4$. Referring to FIGS. 4A and 4B, graphs 414 and 424, respectively, illustrate the peak inductor current versus the output current and the switching frequency versus the output current where the input voltage is around 3.85 V, the output voltage is around 7.2 V and the inductor L is around 2.2 µH. As illustrated in FIGS. 4A and 4B, the start of the seamless transition range occurs when IOUT is between 20 and 30 mA and ends when IOUT is between 40 and 50 mA. In this seamless transition range, $I_{PEAK}$ and $F_{SW}$ are varied to create the seamless transition from one mode to another. In addition, $T_{OFF}$ and $I_{PEAK}$ are set by the control loop via the control currents $I_{EA}$ and $I_{TOFF}$ shown in FIG. 2. The core of the control loop is formed by error amplifier circuitry 202. In the current mode control system, $I_{VT}$ controls $I_{EA}$ and $I_{TOFF}$. The two feedback resistors ($R_{FB1}$ and $R_{FB2}$), OTA 203, $R_C$, $C_C$ and $R_{VT}$ form the compensation and central control circuitry.

Figure 5:
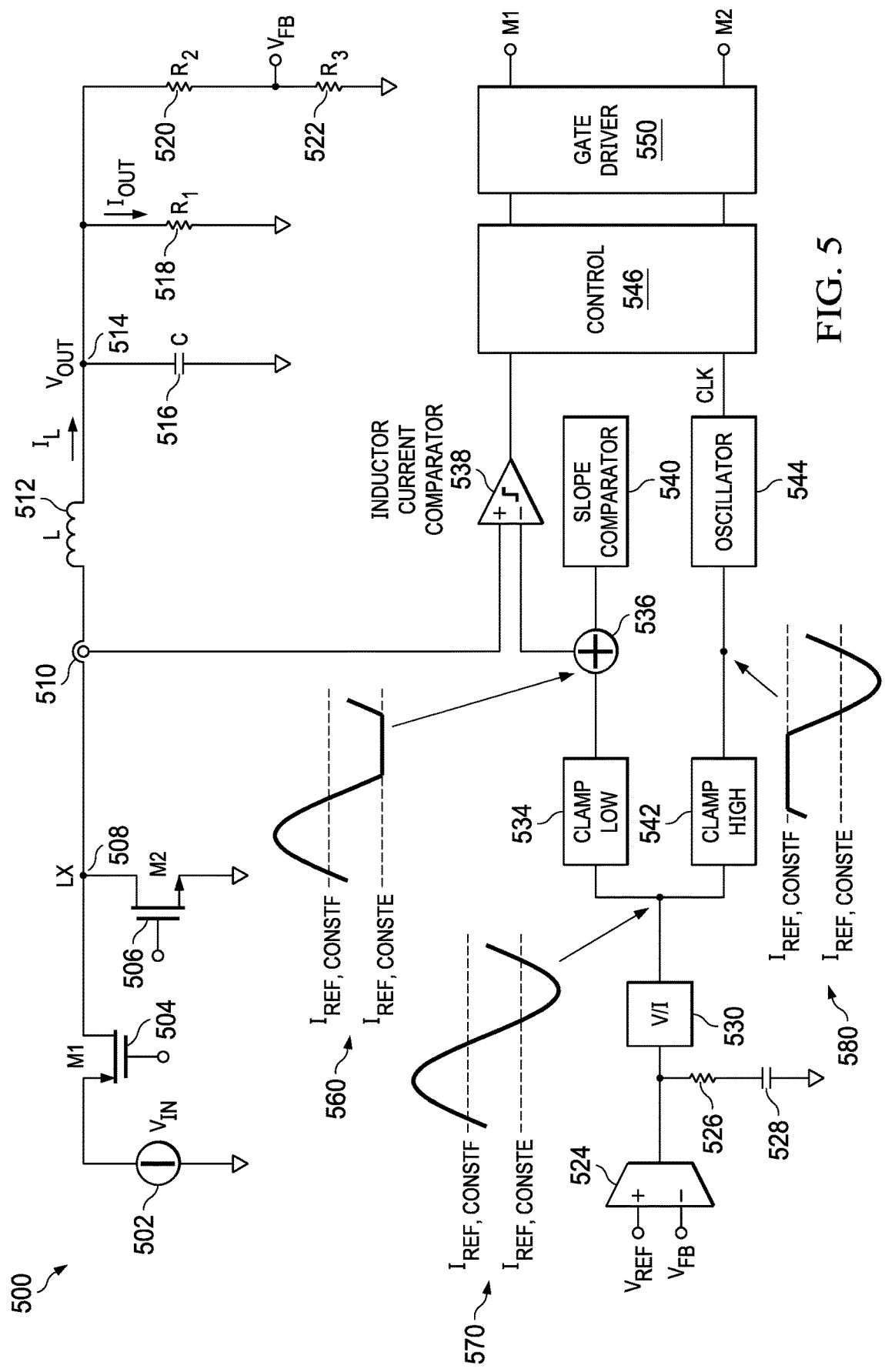
FIG. 5 shows a schematic diagram of a DC-DC buck converter in accordance with various example embodiments.
Figure 6:
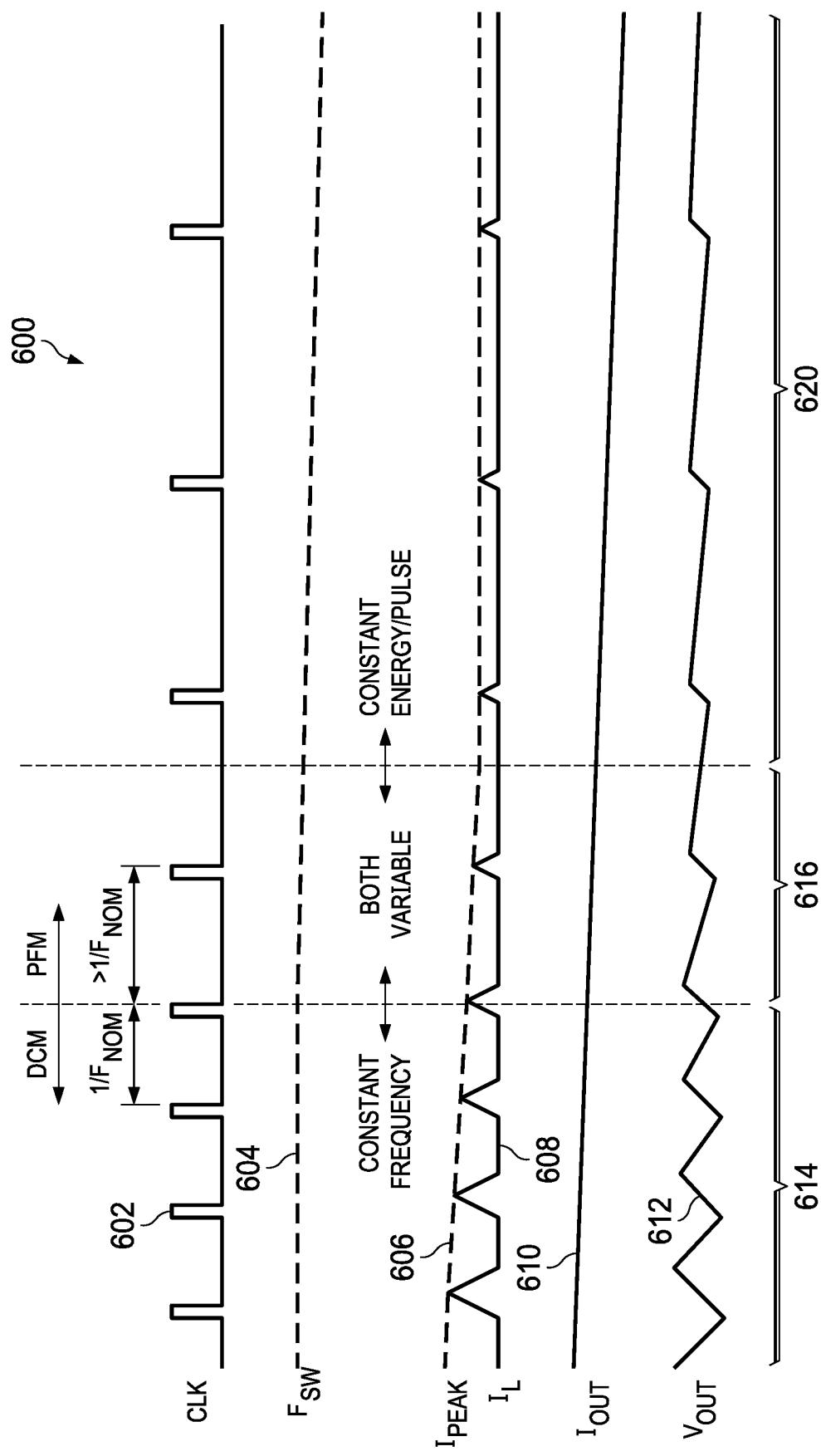
FIG. 6 includes graphs of clock (CLK), switching frequency, peak inductor current, output current and output voltage ($V_{OUT}$) versus time for the DC-DC converter of FIG. 5 in accordance with various examples.

The following description of several example embodiments is in reference to FIGS. 5 and 6. The transition between a fixed frequency mode (such as CCM or DCM) and a reduced frequency mode (such as PSM or PFM) can cause output ripple during the transition between one type of mode of regulation to the other. Several example embodiments seek to minimize output ripple while providing high-efficiency.

FIG. 5 depicts a modified DC-DC converter 500 that can operate using single-pulse skip mode/PFM. Certain components of converter 500 are similar to components of converter 200. For example, resistors 520, 522 and 526 are similar to $R_{FB1}$, $R_{FB2}$ and $R_C$; capacitor 528 is similar to capacitor $C_C$; and OTA 524 is similar to OTA 203. Converter 500 includes input voltage supply 502 connected to the source of transistor 504 (also referred to as M1). The drain of transistor 504 is connected to switching node 508 (also referred to as node LX), the drain of transistor 506 (also referred to as M2) and inductor 512 (also referred to as inductor L). Current sensor 510 is depicted between node LX and the inductor 512 so as to sense the current through inductor 512, but the current sensor 510 may be placed between inductor 512 and output node 514. Capacitor 516 and load 518 (also referred to as resistive element R1) are connected in parallel between output node 514 and ground. Additionally, output node 514 is connected to ground through a resistive divider including resistors 520 (R2) and 522 (R3).

Converter 500 additionally includes control and drive circuitry that includes resistor 526, capacitor 528, error amplifier 524, inductor current comparator 538, voltage-to-current converter 530 (which is equivalent to transistor 220 and resistor $R_{VT}$ in FIG. 2), clamping circuits 534 and 542, slope compensation circuit 540, current controlled oscillator 544, control digital circuitry 546 and gate driver(s) 550. Graphs 560, 570 and 580 are included in FIG. 5 to illustrate the input ($I_{EA}$) to the clamping circuits 534 and 542 and the outputs of these circuits.

The inputs to error amplifier 524 include a reference voltage ($V_{REF}$) and the feedback voltage ($V_{FB}$) that is obtained from the resistive divider formed by resistors $R_2$ and $R_3$. The output of error amplifier 524 is connected to the input of voltage-to-current converter 530, and the output is current $I_{EA}$ (which is generated from the integration of the error signal $V_{ref}$-$V_{fb}$). Graph 570 illustrates a possible waveform for $I_{EA}$ in some example embodiments. In graphs 560, 570 and 580, $I_{REF,CONSTF}$ is a reference current where the mode of operation involves a constant frequency and $I_{REF,CONSTE}$ is a reference current where the mode of operation involves a constant energy/pulse.

The output of voltage-to-current converter 530 is provided to both low-clamping circuit 534 and high-clamping circuit 542. In the example embodiments where graph 570 represents that input to clamping circuits 534 and 542, the output of low-clamping circuit 534 may be as depicted in graph 560 where the current is clamped so that it is not less than reference current $I_{REF,CONSTE}$. Similarly, the output of high-clamping circuit 542 may be as depicted in graph 580 where the current is clamped so that it is not greater than reference current $I_{REF,CONSTF}$. By clamping the currents that are input to both the inverting input of the inductor current comparator 538 and oscillator 544, there should not be a value for the current input into these circuits that results in zero system gain, which may cause loop instability and large output voltage ripple and sub-harmonic oscillations.

The output of high-clamping circuit 542 is input to variable oscillator 544. Since the output of high-clamping circuit 542 is clamped to a maximum value, the maximum switching frequency is also clamped to a maximum value. The output of variable oscillator 544 is a signal (such as CLK signal 602 in FIG. 6) that includes a series of peaks and valleys occurring at a frequency set by variable oscillator 544. The frequency may be fixed or it may vary based on the regulated current provided by voltage-to-current converter 530. The output of variable oscillator 544 is input into digital control circuitry 546 and, ultimately, is used to drive high-side transistor 504 and low-side transistor 506 via gate driver 550.

The output of low-clamping circuitry 534 is summed (via summer 536) with the output of slope compensation circuitry 540 and the summed value is provided to the inverting input of inductor current comparator 538. To achieve a minimum $T_{ON}$, $I_{EA}$ is clamped by low-clamping circuitry 534. In addition, an offset is introduced (by slope compensation circuitry 540) to the output of low-clamping circuitry 534, so that the inductor reference current will remain greater than zero. The slope compensation circuitry 540 may or not be required depending on the duty cycle to obtain voltage loop stability. During each switching cycle, the inductor current comparator 538 regulates the peak inductor current, $I_{PEAK}$, (for example, the maximum/peak inductor current within one switching cycle) to be proportional to the sum provided by summer 536. In other words, the output of inductor current comparator 538 is indicative of whether the current through inductor 512 is less than $I_{PEAK}$ and this output is provided to digital control circuitry 546 that, in turn, regulates the high-side and low-side transistors to regulate the inductor current.

In some example embodiments, the following conditions apply:
 (1) if $I_{EA}$ is greater than $I_{REF,CONSTE}$, the energy per switching pulse is modulated by the error amplifier 524;
 (2) if $I_{EA}$ is less than $I_{REF,CONSTE}$, the energy per switching pulse is "quasi constant";
 (3) if $I_{EA}$ is less than $I_{REF,CONSTF}$, the switching frequency is modulated by the error amplifier 524; and (4) if $I_{EA}$ is greater than $I_{REF,CONSTF}$, the switching frequency is "quasi constant".

Where "quasi constant" means that the value is not regulated by the loop (the output of amplifier 524) but clamped to pre-defined values. These values might be constant or based on the operating point (e.g. $V_{IN}$, $V_{OUT}$).

In some example embodiments, $I_{REF,CONSTE}$ is selected to be less than $I_{REF,CONSTF}$. Accordingly, for $I_{REF,CONSTF}>I_{EA}>I_{REF,CONSTE}$, both energy per pulse and pulse frequency are modulated simultaneously by the control loop, thereby creating a seamless transition range between the operating modes DCM and PFM. Hence, the control loop modulates at least one parameter (such as pulse frequency or energy per pulse) changing the average energy transfer to the output. Embodiments without a seamless transition range may feature an operating range where the control loop cannot change at least one parameter impacting the energy transfer to the output (such as $I_{REF,CONSTE}$ greater than $I_{REF,CONSTF}$). This may be caused by manufacturing tolerances, and will result in a zero system gain causing instability and increased output ripple due to repetitive mode transitions between DCM and PFM (sub-harmonic oscillations). For the example embodiments, the switching frequency in PFM can be changed by changing $I_{REF,CONSTE}$ (changing $I_{REF,CONSTE}$ changes the maximum switching frequency as well as the transition range).

With reference to FIG. 6 and converter 500 of FIG. 5, graph 600 illustrates various signal characteristics (such as frequency and magnitude) of certain voltages and currents versus time (horizontal axis) for several example embodiments where the load current, $I_{OUT}$, is decreasing. Graph 600 illustrates three time regions, regions 614, 616 and 618. Region 614 is a constant frequency/variable energy region (such as CCM or DCM) where the clock 602, CLK, period is shown to be $1/f_{NOMINAL}$. Region 618 is a constant energy/pulse region (such as PFM or PSM) with a variable switching frequency 604 (the CLK period is shown to be greater than $1/f_{NOMINAL}$). Region 616 is the transition region (similar to the transition region in graph 306 of FIG. 3) for several example embodiments. To provide a seamless transition from CCM/DCM to PFM/PSM, region 616 utilizes variable switching frequency 604 (illustrated as varying periods of CLK and $I_L$ and varying $F_{SW}$) and variable energy/pulse (illustrated as varying heights for $I_L$). Graph 600 includes graphs for the clocking signal 602, switching frequency 604, peak inductor current 606, inductor current 608, load current 610 and output voltage 612.

For a decreasing load current, $I_{OUT}$, the regulation loop (including the feedback divider formed by resistors 520 and 522, error amplifier 524 and compensation formed by resistor 526 and capacitor 528) will decrease the energy transmitted per clock pulse by lowering the reference current (provided at the inverting input) for the inductor current comparator 538. In addition, in some example embodiments, the switching frequency is reduced to lower dynamic switching losses and thereby improve system efficiency during light-load periods. Reducing the switching frequency is also helpful to avoid output voltage runaway, because the amount of energy transmitted per pulse is greater than zero.

While the figures show a particular type of transistor, other transistors (such as metal-oxide-semiconductor field-effect transistors or bipolar transistors) may be used in place of the ones that are illustrated. In addition, n-type and p-type devices may be used in replacement for the other type of device. While converters 200 and 500 utilize a single inductor, converters 200 and 500 may be multi-phase converters that utilize more than one inductor.

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "approximately" preceding a value means +/−10 percent of the stated value. As used herein, the term "modulate" shall also mean "to vary" or "to change."

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A converter operable to convert an input voltage at an input node to an output voltage at an output node by switching on and off a transistor at a switching frequency, the converter comprising:
   an error amplifier circuit having a first input coupled to a reference voltage, a second input coupled to the output node through a resistive divider, a first output operable to output a control current and a second output operable to output a current equivalent to the control current;
   a peak current comparator circuit having a first input coupled to the second output of the error amplifier circuit, a second input and an output, the second input of the peak current comparator is adapted to be coupled to the input node through an inductor;
   an off-time timer circuit having an input coupled to the first output of the error amplifier circuit and having an output, the off-time timer circuit operable to set the switching frequency based on the control current; and
   a control circuit having a first input coupled to the output of the peak current comparator circuit, a second input coupled to the output of the off-time timer circuit and an output coupled to a control terminal of the transistor.

2. The converter of claim 1, wherein the converter is operable to operate in a mode of operation selected from the group consisting of: continuous conduction mode (CCM), discontinuous conduction mode (DCM), pulse frequency mode (PFM) and pulse width modulation mode (PWM).

3. The converter of claim 2, wherein the converter is operable to switch from one mode operation to another mode of operation.

4. The converter of claim 3, wherein the converter is operable to reduce voltage ripple on the output voltage during a transition from one mode of operation to another mode of operation.

5. The converter of claim 1, wherein the output current is modulated from a valley current value to a peak current value at the switching frequency.

6. The converter of claim 5, wherein the peak current comparator circuit is operable to set the peak current value based on the control current.

7. The converter of claim 1, wherein the error amplifier circuit includes:
an error amplifier having inputs coupled to the first and second inputs of the error amplifier circuit and an output;
a first transistor having a first current terminal coupled to a supply voltage, a second current terminal coupled to the output of the error amplifier and a control terminal coupled to the second current terminal, the first transistor having a transistor current equivalent to the control current;
a second transistor having a first current terminal coupled to the supply voltage, a second current terminal coupled the input of the off-time timer circuit and a control terminal coupled to the control terminal of the first transistor, the first transistor and the second transistor form a first current mirror; and
a third transistor having a first current terminal coupled to the supply voltage, a second current terminal coupled the first input of the peak comparator circuit and a control terminal coupled to the control terminal of the first transistor, the first transistor and the third transistor form a second current mirror.

8. The converter of claim 7, wherein a current from the first current terminal to the second current terminal of the second transistor is equivalent to the control current and a current from the first current terminal to the second current terminal of the third transistor is equivalent to the control current.

9. A control circuit operable to switch a transistor on and off at a switching frequency to convert an input voltage at an input node to an output voltage at an output node, the control circuit comprising:
an error amplifier circuit operable to generate a control current and having a first output operable to output a first output current and having a second output operable to output a second output current, the first output current and the second output current are equivalent to the control current;
a peak current comparator circuit having a first input coupled to the second output of the error amplifier circuit, a second input and an output, the second input is adapted to be coupled to the input node through an inductor;
an off-time timer circuit having an input coupled to the first output of the error amplifier circuit and an output, the off-time timer circuit operable to set the switching frequency based on the control current; and
a control circuit having a first input coupled to the output of the peak current comparator circuit, a second input coupled to the output of the off-time timer circuit and an output coupled to a control terminal of the transistor.

10. The control circuit of claim 9, wherein, based on control signals from the control circuit, the converter is operable to operate in a mode of operation selected from the group consisting of: continuous conduction mode (CCM), discontinuous conduction mode (DCM), pulse frequency mode (PFM) and pulse width modulation mode (PWM).

11. The control circuit of claim 10, wherein the converter is operable to switch from a first mode operation to a second mode of operation.

12. The control circuit of claim 11, wherein current through the inductor is modulated from a valley current value to a peak current value at the switching frequency.

13. The control circuit of claim 12, wherein during the first mode of operation the switching frequency is fixed and the peak current value is variable.

14. The control circuit of claim 12, wherein during the second mode of operation the switching frequency is variable and the peak current value is fixed.

15. The control circuit of claim 12, wherein the converter is operable to operate in a transition mode of operation after the first mode of operation and before the second mode of operation, and the switching frequency and the peak current value are variable during the transition mode of operation.

16. The control circuit of claim 9, wherein current through the inductor is modulated from a valley current value to a peak current value at the switching frequency.

17. The control circuit of claim 16, wherein the peak current comparator circuit is operable to set the peak current value based on the control current.

18. A method of operating a converter operable to convert an input voltage at an input node to an output voltage at an output node, the method comprising the steps of:
switching a transistor on and off during a heavy load period at a fixed switching frequency to provide pulses of current to the load and varying a maximum current per pulse of current;
switching the transistor on and off during a light load period at a fixed maximum current per pulse of current and varying the switching frequency; and
switching the transistor on and off during a period between the heavy load period and the light load period by varying the switching frequency and the maximum current per pulse of current.

19. The method of claim 18, wherein the maximum current per pulse of current is $I_{PEAK}$.

20. The method of claim 18, where in switching frequency is $F_{SW}$.

* * * * *